United States Patent [19]
Sato

[11] Patent Number: 5,258,645
[45] Date of Patent: Nov. 2, 1993

[54] SEMICONDUCTOR DEVICE HAVING MOS TRANSISTOR AND A SIDEWALL WITH A DOUBLE INSULATOR LAYER STRUCTURE

[75] Inventor: Noriaki Sato, Tokyo, Japan

[73] Assignee: Fujitsu Limited, Kawasaki, Japan

[21] Appl. No.: 939,433

[22] Filed: Sep. 4, 1992

Related U.S. Application Data

[63] Continuation of Ser. No. 666,736, Mar. 8, 1991, abandoned.

[30] Foreign Application Priority Data

Mar. 9, 1990 [JP] Japan ................................ 2-58919

[51] Int. Cl.⁵ .................... H01L 27/02; H01L 29/34
[52] U.S. Cl. .................................. 257/637; 257/324; 257/369; 257/392; 257/408; 257/410; 257/411; 257/639; 257/640; 257/641
[58] Field of Search .................. 357/23.5, 42, 43, 54, 357/23.9; 257/324, 327, 368, 369, 371, 392, 408, 410, 411, 635, 637–641, 644, 649, 650

[56] References Cited

U.S. PATENT DOCUMENTS

| | | | |
|---|---|---|---|
| 4,271,582 | 6/1981 | Shirai et al. | 357/54 |
| 4,516,313 | 8/1985 | Turi et al. | 357/23.5 |
| 4,641,420 | 2/1987 | Lee | 357/65 |
| 4,740,484 | 4/1988 | Norstroem et al. | 357/71 |
| 4,745,083 | 5/1988 | Huie | 357/42 |
| 4,768,080 | 8/1988 | Sato | 357/54 |
| 4,769,686 | 9/1988 | Horiuchi et al. | 357/42 |
| 4,982,250 | 1/1991 | Manos, II et al. | 357/54 |

FOREIGN PATENT DOCUMENTS

| | | |
|---|---|---|
| 0123384 | 10/1984 | European Pat. Off. . |
| 0218408 | 4/1987 | European Pat. Off. . |
| 57-107067 | 7/1982 | Japan . |
| 110761 | 4/1989 | Japan . |

OTHER PUBLICATIONS

Mizuno et al., "$Si_3N_4/SiO_2$ Spacer Induced High Reliability in LDDMOSFET and Its Simple Degradation Model", IEDM 88, 1988 pp. 234–237.

*Primary Examiner*—J. Carroll
*Attorney, Agent, or Firm*—Staas & Halsey

[57] ABSTRACT

A semiconductor device including a semiconductor substrate with a P-type well formed in the semiconductor substrate and a gate insulator layer formed on the semiconductor substrate. N-type diffusion regions are formed in the P-type well on both sides of the gate insulator layer. A gate electrode is formed on the gate insulator layer, where the gate electrode has top and side surfaces. The gate electrode and the N-type diffusion regions respectively form gate, source and drain of a N-channel MOS transistor. An insulating layer covers a portion of the N-type diffusion regions, the side surfaces of the gate electrode and at least a portion of the top surface of the gate electrode. The side wall layer which is made of an insulating material is formed on the insulating layer to provide a smooth coverage around the side of the gate electrode and aligns with an edge of said insulating layer which stops covering the N-type diffusion regions.

8 Claims, 6 Drawing Sheets

SEMICONDUCTOR DEVICE HAVING MOS TRANSISTOR AND A SIDEWALL WITH A DOUBLE INSULATOR LAYER STRUCTURE

This application is a continuation of application Ser. No. 07/666,736, filed Mar. 8, 1991, now abandoned.

BACKGROUND OF THE INVENTION

The present invention generally relates to semiconductor devices and methods of producing semiconductor devices, and more particularly to a semiconductor device having a metal oxide semiconductor (MOS) transistor provided on a substrate and a method of producing such a semiconductor device having high integration density and improved characteristics.

Recently, in order to further improve the integration density of integrated circuits (ICs), there is a demand to change a P-channel MOS transistor from a buried channel type into a surface channel type. For this reason, it is necessary to form a gate electrode from a P-type polysilicon instead of an N-type polysilicon. Ion implantation and thermal diffusion are carried out to form the gate electrode into the P-type, but there is a problem in that the P-type impurities and particularly boron (B) easily penetrate the gate electrode and reach the channel portion. The above described problem is caused by the large $R_p$ of the P-type impurities such as B and the fact that the diffusion easily occurs within silicon dioxide ($SiO_2$), where $R_1$ denotes a depth of the ion implantation from a surface.

As one method of overcoming the above described problem, there is a known method of forming a gate insulator layer of the P-channel MOS transistor from a composite layer of $SiO_2$ and silicon nitride ($Si_3N_4$) layers in order to suppress the diffusion of the P-type impurities into the channel portion, instead of forming the gate insulator layer of the P-channel MOS transistor solely from a $SiO_2$ layer. The P-type impurities are much less likely to diffuse into the $Si_3N_4$ layer when compared to the $SiO_2$ layer, and the $Si_3N_4$ acts as a stopper with respect to the impurity diffusion.

A conventional method of producing a semiconductor device will now be described with reference to FIGS. 1A through 1F.

In FIG. 1F, the completed semiconductor device includes a silicon (Si) substrate 31, a $SiO_2$ field oxide layer 32, a P-channel MOS transistor region 33 in which a P-channel MOS transistor is formed, and an N-channel MOS transistor region 34 in which an N-channel MOS transistor is formed. An N-type well 35 is formed in the P-channel MOS transistor region 33, and a P-type well 36 is formed in the N-channel MOS transistor region 34. A silicon oxide layer 37 is made of $SiO_2$ or the like, a silicon nitride layer 38 is made of $Si_3N_4$ or the like, and a silicon oxide layer 39 is made of $SiO_2$ or the like. A gate insulator layer 40 is made up of the silicon oxide layers 37 and 29 and the silicon nitride layer 38. A gate insulator layer 41 is made of $SiO_2$ or the like, and a polysilicon layer 42 is provided for forming a gate electrode. A gate electrode 43 is formed in the P-channel MOS transistor region 33, and a gate electrode 44 is formed in the N-channel MOS transistor region 34. A substrate diffusion layer 45 is formed in the P-channel MOS transistor region 33 and functions as a source/drain diffusion layer. A substrate diffusion layer 46 is formed in the N-channel MOS transistor region 34 and functions as a source/drain diffusion layer. An interlayer insulator layer 47 is made of phospho-silicate glass (PSG) or the like. A contact hole 48 is formed in the interlayer insulator layer 47, and an interconnection layer 49 is made of aluminum (Al) or the like.

The semiconductor device shown in FIG. 1F is produced as follows.

First, as shown in FIG. 1A, the substrate 31 is selectively thermally oxidized by local oxidation of silicon (LOCOS), so as to form the field oxide layer 32 as an isolation region and to form the P-channel MOS transistor region 33 and the N-channel MOS transistor region 34 as active regions. Ion implantation is used to implant N-type impurities in a region where a P-channel MOS transistor is formed and to implant P-type impurities in a region where an N-channel MOS transistor is formed, and the N-type well 35 and the P-type well 36 are formed by a thermal process. Then, the silicon oxide layer 37 which is made of $SiO_2$ is formed on the entire surface by a thermal oxidation, for example. $Si_3N_4$ is accumulated on the silicon oxide layer 37 by a chemical vapor deposition (CVD), for example, so as to form the silicon nitride layer 38. Thereafter, the silicon nitride layer 38 is oxidized by a thermal oxidation, for example, so as to form on the surface of the silicon nitride layer 38 the silicon oxide layer 39 which is made of $SiO_2$.

Next, as shown in FIG. 1B, the silicon oxide layer 39, the silicon nitride layer 38 and the silicon oxide layer 37 of the N-channel MOS transistor region 34 are selectively etched by a reactive ion etching (RIE), for example. Hence, the gate insulator layer 40 made up of the silicon oxide layer 37, the silicon nitride layer 38 and the silicon oxide layer 39 is formed in the P-channel MOS transistor region 33 while the substrate 31 is exposed in the N-channel MOS transistor region 34.

Then, as shown in FIG. 1C, the gate insulator layer 41 made of $SiO_2$ is formed in the N-channel MOS transistor region 34 by a thermal oxidation, for example. In this state, the silicon nitride layer 38 is further oxidized and increases the thickness of the silicon oxide layer 39.

Next, as shown in FIG. 1D, a polysilicon layer 42 is accumulated to cover the entire surface of the P-channel MOS transistor region 33 and the N-channel MOS transistor region 34 by a CVD, for example. This polysilicon layer 42 is used for the gate electrode and the resistivity thereof is decreased by impurity doping.

Thereafter, as shown in FIG. 1E, the polysilicon layer 42 and the gate insulator layers 40 and 41 of the respective P-channel MOS transistor region 3 and the N-channel MOS transistor region 34 are selectively etched by a RIE, for example, so as to form the gate electrode 43 in the P-channel MOS transistor region 33 and the gate electrode 44 in the N-channel MOS transistor region 34. In this state, the substrate 31 the N-type well or the P-type well 36) is exposed in the P-channel MOS transistor region 33 and the N-type MOS transistor region 34. The gate electrode 43 of the P-channel MOS transistor region 33 and the gate electrode 44 of the N-channel MOS transistor region 34 may be formed independently. For example, the gate electrode 44 of the N-channel MOS transistor region 34 may be formed after the gate electrode 43 of the P-channel MOS transistor region 33 is formed.

In addition, it is possible to leave the silicon oxide layer 37 or the gate insulator layer 41 by etching the gate electrode using an etchant which has a high selectivity.

Next, the substrate diffusion layer 45 which becomes the source/drain diffusion layer is formed in the P-channel MOS transistor region 33, and the substrate diffusion layer 46 which becomes the source/drain diffusion layer is formed in the N-channel MOS transistor region 34. In addition, the interlayer insulator layer 47 which is made up of SiO$_2$ and PSG is formed on the entire surface to cover the P-channel MOS transistor region 33 and the N-channel MOS transistor region 34. The contact holes 48 are formed in the interlayer insulator layer 47 and the substrate diffusion layers 45 and 46 so as to expose the gate electrodes 43 and 44. Thereafter, the Al interconnection layer 49 is formed to make contact with the substrate diffusion layers 45 and 46 and the gate electrodes 43 and 44 via the contact holes 48. As a result, the completed semiconductor device shown in FIG. 1F is obtained.

However, according to the conventional method, there is a problem in that it is impossible to independently form the gate insulator layers 40 and 41 of the respective P-channel MOS transistor and the N-channel MOS transistor. Furthermore, there are problems in that the thicknesses of the gate insulator layers 40 and 41 cannot be controlled to desired values and it is impossible to optimize the threshold voltage $V_{th}$ or the like of the MOS transistors.

The thicknesses of the gate insulator layers 40 and 41 cannot be controlled to the desired values for the following reasons. That is, when the silicon nitride layer 38 which is provided at the P-channel MOS transistor region 33 to act as a diffusion stopper is oxidized at a high temperature of 1000° C., for example, the thickness of the SiO$_2$ gate insulator layer 41 in the N-channel MOS transistor region 34 may become greater than the desired value. On the other hand, when an attempt is made to control the thickness of the gate insulator layer 41 in the N-channel MOS transistor region 34 to the desired value, a SiO$_2$ layer of a sufficient thickness cannot be formed on the silicon nitride layer 38 in the P-channel MOS transistor region 33 and the thickness of the silicon oxide layer 39 becomes less than the desired value, thereby making the withstand voltage poor. The oxidation of the silicon nitride layer 38 is carried out at the high temperature in order to stop the leak current caused by the trap of the silicon nitride layer and to prevent the initial short-circuit by mutually compensating for the pin holes existing in each layer of the multi-layer insulator layer. In addition, the oxidation of the silicon nitride layer 38 is also carried out to increase the thickness of the silicon oxide layer 39 and improve the withstand voltage, so that the deterioration caused by hot carriers is suppressed and the life time of the device as a result is prolonged.

SUMMARY OF THE INVENTION

Accordingly, it is a general object of the present invention to provide a novel and useful semiconductor device and method of producing the semiconductor device, in which the problems described above are eliminated.

Another and more specific object of the present invention is to provide a method of producing a semiconductor device which comprises a CMOS circuit including at least an N-channel MOS transistor and a P-channel MOS transistor, comprising the steps of forming an isolation region, a P-channel MOS transistor region and an N-channel MOS transistor region in a semiconductor substrate, where the P-channel MOS transistor region has an N-type well in the semiconductor substrate and the N-channel MOS transistor region has a P-type well in the semiconductor substrate, successively forming a first insulator layer and a first conductor layer on the semiconductor substrate so as to cover the N-channel MOS transistor region, forming a first gate electrode and a first gate insulator layer of the N-channel MOS transistor on the P-type well in the N-channel MOS transistor region by selectively etching the first conductor layer and the first insulator layer, successively forming a second insulator layer and a second conductor layer on the semiconductor substrate so as to cover at least the P-channel MOS transistor region, and forming a second gate electrode and a second gate insulator layer of the P-channel MOS transistor on the N-type well in the P-channel MOS transistor region by selectively etching the second conductor layer and the second insulator layer. According to the method of the present invention, it is possible to form the gate insulator layers of the P-channel and N-channel MOS transistors to the desired thicknesses. Hence, the threshold voltage and the like of the transistors can be optimized and the transistor characteristics are improved.

Still another object of the present invention is to provide a semiconductor device comprising a semiconductor substrate, a P-type well formed in the semiconductor substrate, a gate insulator layer formed on the semiconductor substrate, N-type diffusion regions formed in the P-type well on both sides of the gate insulator layer, a gate electrode formed on the gate insulator layer, where the gate electrode has top and side surfaces and the gate electrode and the N-type diffusion regions respectively form gate, source and drain of an N-channel MOS transistor, an insulating layer which covers a portion of the N-type diffusion regions, the side surfaces of the gate electrode and at least a portion of the top surface of the gate electrode, and a sidewall layer which is made of an insulating material and is formed on the insulating layer to provide a smooth coverage around the side of the gate electrode. According to the semiconductor device of the present invention, it is possible to protect the gate electrode of the N-channel MOS transistor by the provision of the insulating layer.

A further object of the present invention is to provide a semiconductor device having a CMOS circuit which includes at least a P-channel MOS transistor and an N-channel MOS transistor. The semiconductor device comprises a semiconductor substrate, and a P-channel MOS transistor region and an N-channel MOS transistor region isolated by an isolation region formed on the semiconductor substrate. The P-channel MOS transistor region comprises an N-type well formed in the semiconductor substrate, a first gate insulator layer formed on the semiconductor substrate, P-type diffusion regions formed in the N-type well on both sides of the first gate insulator layer, and a first gate electrode formed on the first gate insulator layer, where the first gate electrode and the P-type diffusion regions respectively form gate, source and drain of the P-channel MOS transistor. The N-channel MOS transistor region comprises a P-type well formed in the semiconductor substrate, a second gate insulator layer formed on the semiconductor substrate, N-type diffusion regions formed in the P-type well on both sides of the second gate insulator layer, a second gate electrode formed on the second gate insulator layer, where the second gate electrode has top and side surfaces and the second gate electrode and the N-type diffusion regions respectively form gate, source and drain of the N-channel MOS transistor, an insulating layer which covers a portion of the N-type diffusion regions, the side surfaces of the gate electrode and at least a portion of the top surface of the gate electrode, where the insulating layer is made of the same material as the first gate insulator, and a sidewall layer which is made of the same material as the first gate electrode and is formed on the insulating layer to provide a smooth coverage around the side of the second gate electrode.

Other objects and further features of the present invention will be apparent from the following detailed description when read in conjunction with the accompanying drawings.

DESCRIPTION OF THE PREFERRED EMBODIMENTS

An embodiment of a method of producing a semiconductor device according to the present invention will be described with reference to FIGS. 2A through 2J. This embodiment of the method produces an embodiment of a semiconductor device according to the present invention shown in FIG. 2J.

Figure 1A:
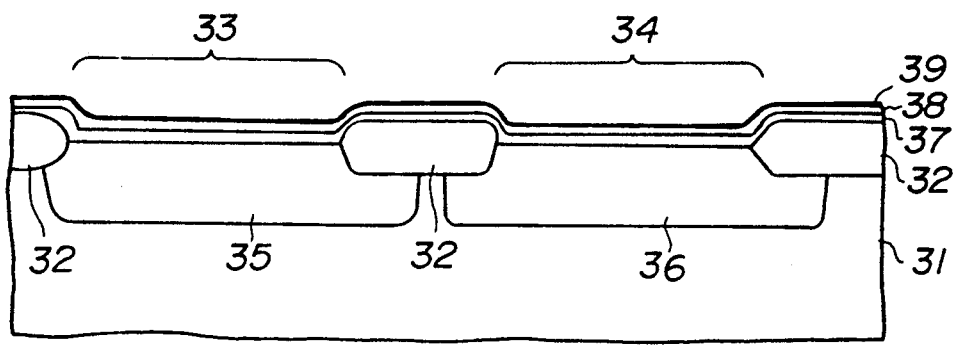
FIGS. 1A through 1F are cross sectional views for explaining an example of a conventional method of producing a semiconductor device.
Figure 1B:
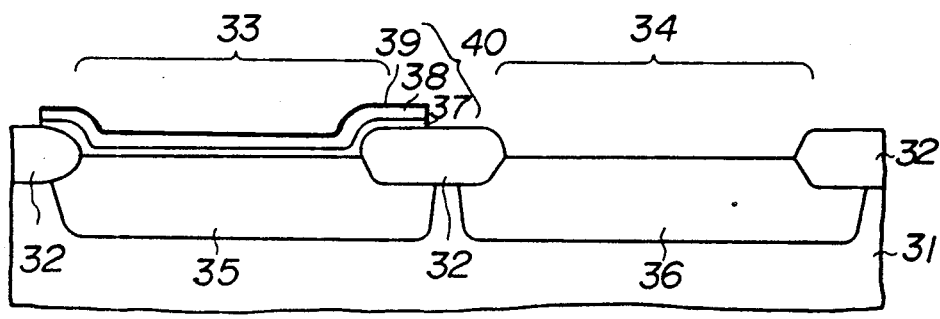
Figure 1C:
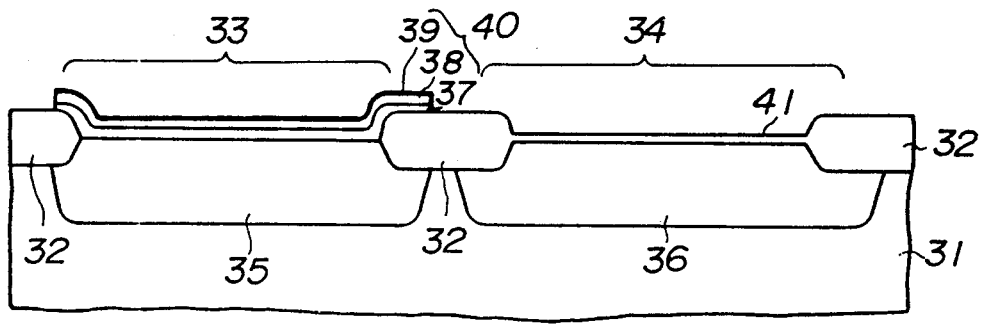
Figure 1D:
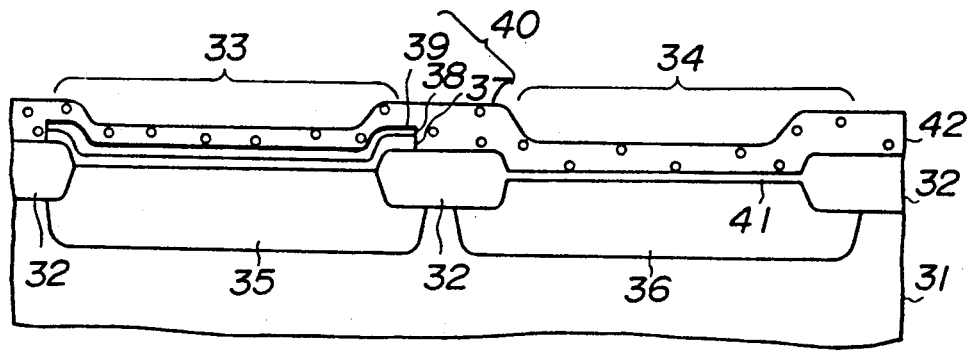
Figure 1E:
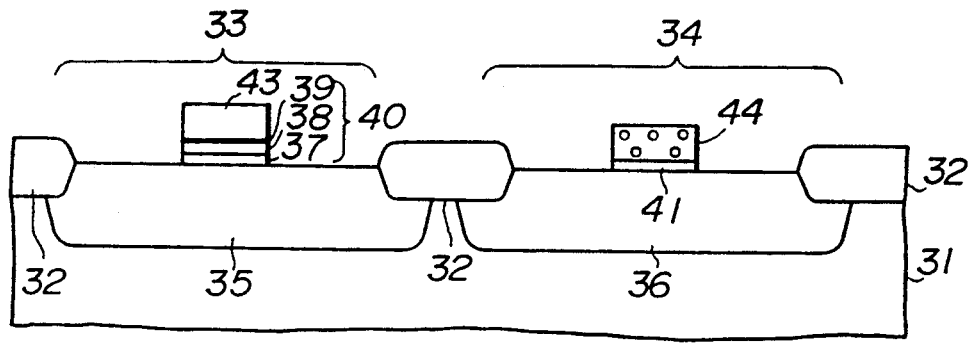
Figure 1F:
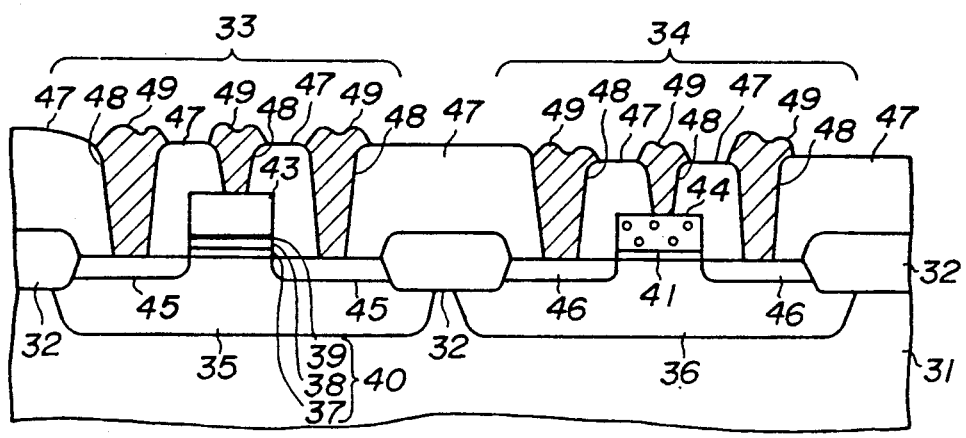
Figure 2A:
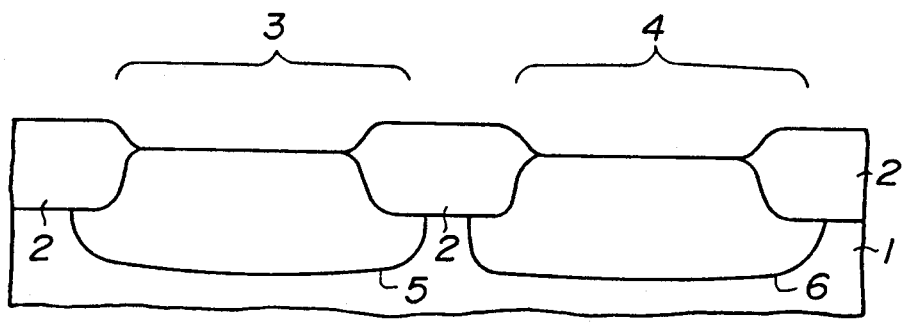
FIGS. 2A through 2J are cross sectional views for explaining an embodiment of a method of producing a semiconductor device according to the present invention.
Figure 2B:
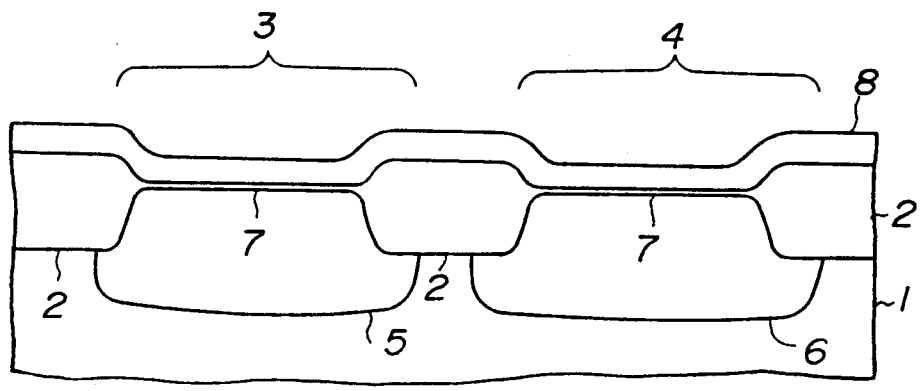
Figure 2C:
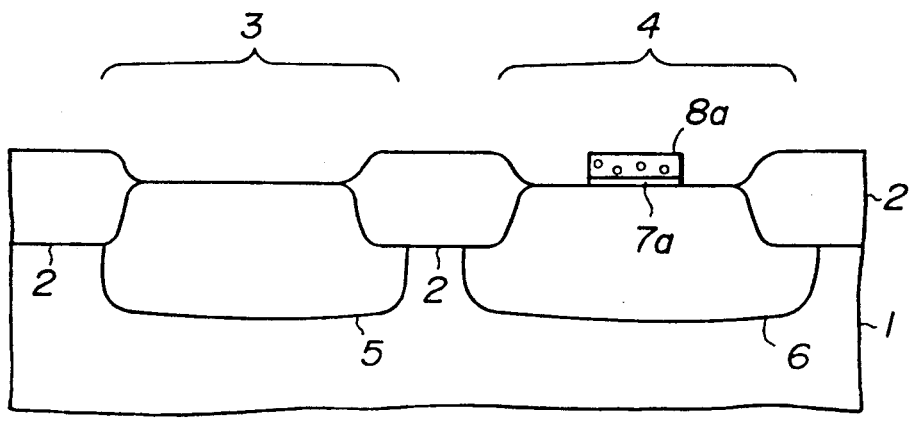
Figure 2D:
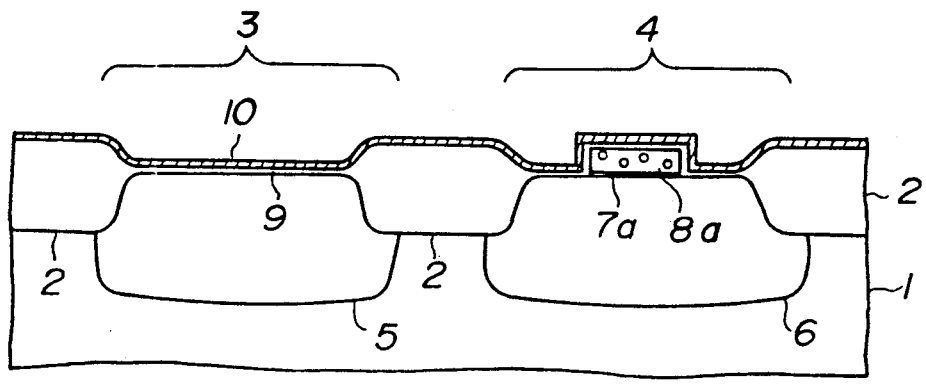
Figure 2E:
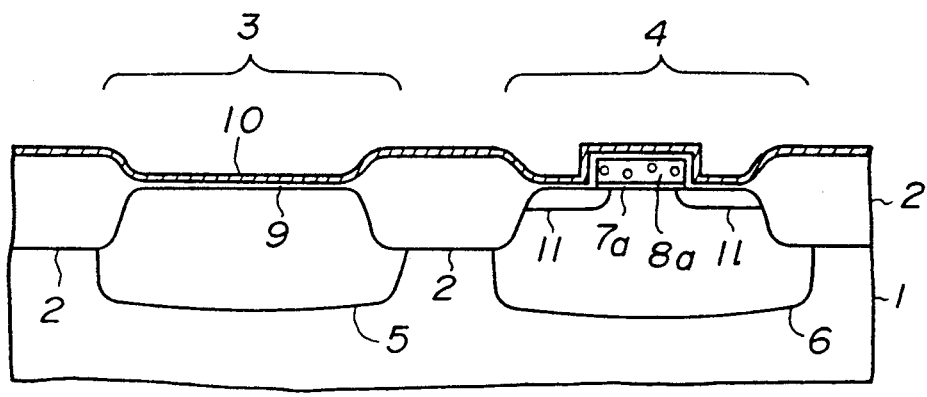
Figure 2F:
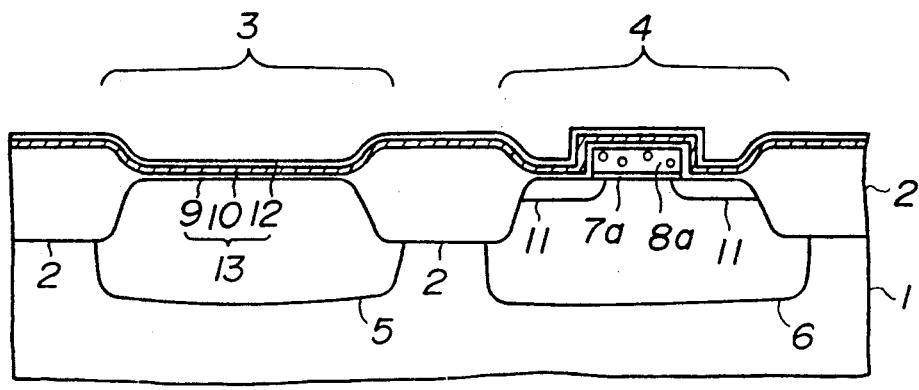
Figure 2G:
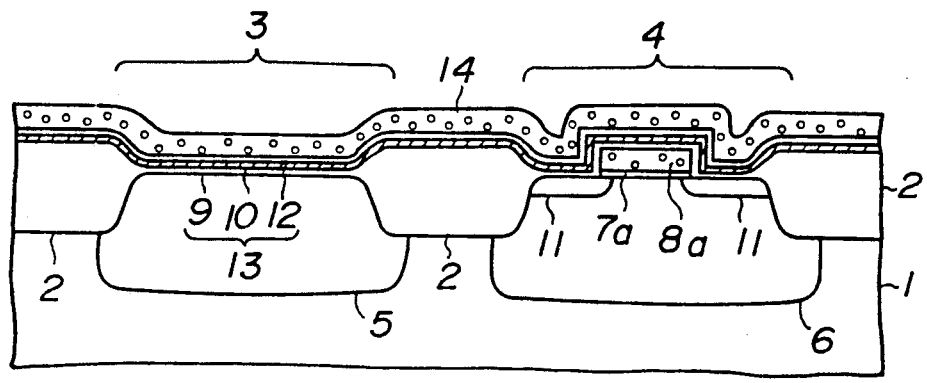
Figure 2H:
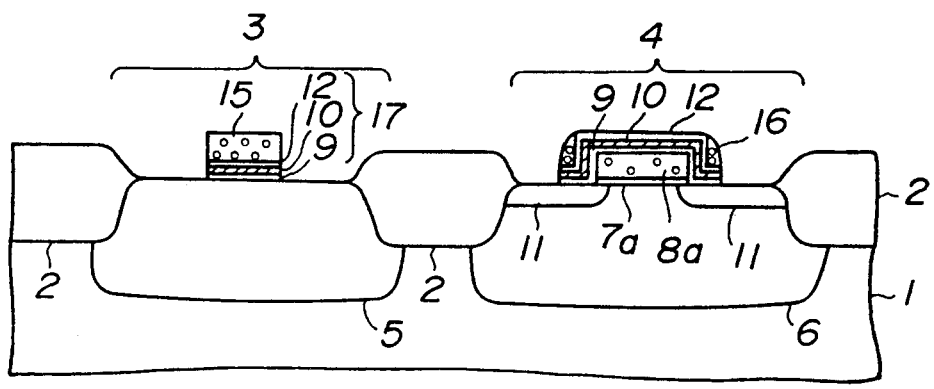
Figure 2I:
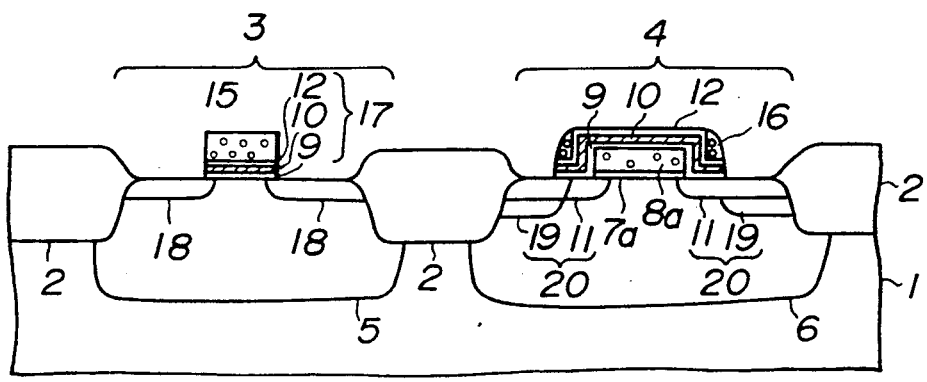
Figure 2J:
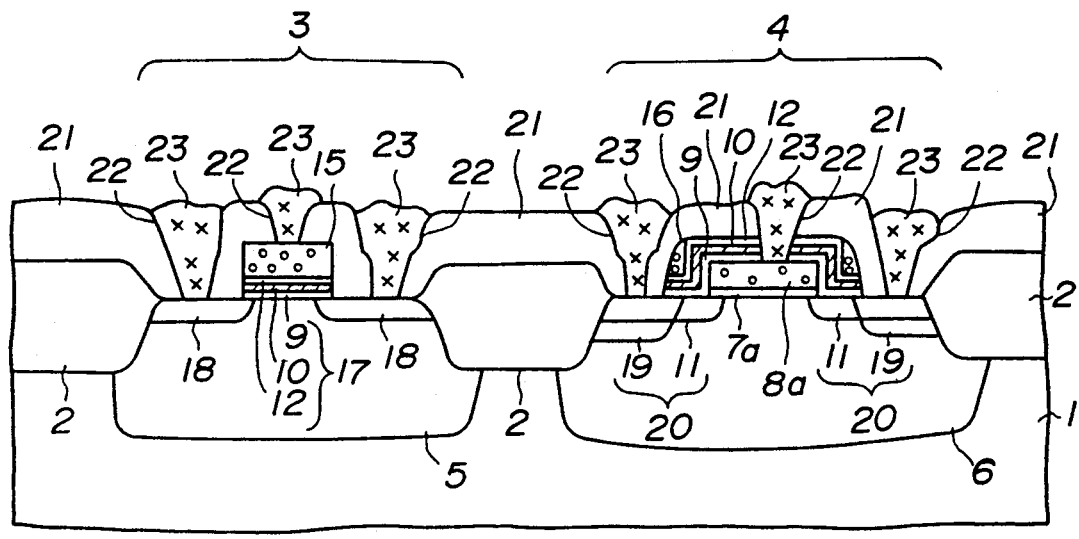

The embodiment of the semiconductor device shown in FIG. 2J includes a semiconductor substrate 1 made of Si or the like, a field oxide layer 2 made of $SiO_2$ or the like, a P-channel MOS transistor region 3, an N-channel MOS transistor region 4, an N-type well 5, and a P-type well 6.

A first insulator layer 7 for forming the gate insulator layer of the N-channel MOS transistor is made of $SiO_2$ or the like, and a first gate insulator layer 7a of the N-channel MOS transistor is made of $SiO_2$ or the like. A first conductor layer 8 for forming the gate electrode of the N-channel MOS transistor is made of polysilicon or the like, and a first gate electrode 8a of the N-channel MOS transistor is made of polysilicon or the like.

A silicon oxide layer 9 for forming the gate insulator layer of the P-channel MOS transistor is made of $SiO_2$ or the like. A silicon nitride layer 10 for forming the gate insulator layer of the P-channel MOS transistor is made of $Si_3N_4$ or the like. A low impurity density diffusion layer 11 is an $n^-$-type layer, for example, and a silicon oxide layer 12 for forming the gate insulator layer of the P-channel MOS transistor is made of $SiO_2$ or the like. A second insulator layer 13 is made up of the silicon oxide layer 9, the silicon nitride layer 10 and the silicon oxide layer 12. A second conductor layer 14 for forming the gate electrode of the P-channel MOS transistor is made of polysilicon or the like. A second gate electrode 15 of the P-channel MOS transistor is made of polysilicon or the like. A side wall layer 16 is made of polysilicon or the like. A second gate insulator layer 16 is made up of the silicon oxide layer 9, the silicon nitride layer 10 and the silicon oxide layer 121. A $p^+$-type substrate diffusion layer 18 acts as a source/drain diffusion layer of the P-channel MOS transistor. A high impurity density diffusion layer 19 is an $n^+$-type layer, for example. A substrate diffusion layer 20 acts as the diffusion layers 11 and 19 which act as the source/drain of the N-channel MOS transistor. An interlayer insulator layer 21 is made of PSG or the like. Contact holes 22 are formed in the interlayer insulator layer 21, and an interconnection layer 23 is made of Al or the like.

First, as shown in FIG. 2A, a silicon nitride layer to be subjected to the LOCOS is formed, and thereafter, the N-type well 5 and the P-type well 6 are formed in the respective P-channel MOS transistor region and the N-channel MOS transistor region 4. Then, the substrate 1 is selectively subjected to a thermal oxidation by LOCOS. As a result, the field oxide layer 2 of 5000 Å, for example, is formed as the isolation region, and the P-channel MOS transistor region 3 and the N-channel MOS transistor region 4 are formed as active regions.

Next, as shown in FIG. 2B, the substrate 1 is oxidized at the P-channel MOS transistor region 3 and the N-channel MOS transistor region 4 by a thermal oxidation, for example, so as to form the first insulator layer 7. The insulator layer 7 forming the gate insulator layer of the N-channel MOS transistor has a thickness of 100 Å, for example, and is formed on the substrate 1 so as to cover the N-channel MOS transistor region 4. Thereafter, a polysilicon is accumulated on the first insulator layer 7 by a CVD, for example, so as to form the first conductor layer 8. This first conductor layer 8 for forming the gate electrode of the N-channel MOS transistor has a thickness of 2500 Å, for example.

Then, as shown in FIG. 2C, the first conductor layer 8 and the first insulator layer 7 are selectively etched by a RIE, for example, so as to form the first gate electrode 8a and the first gate insulator layer 7a in the N-channel MOS transistor region 4.

Next, as shown in FIG. 2D, the silicon oxide layer 9 is formed by a thermal oxidation, for example. The silicon oxide layer 9 for forming the gate insulator layer of the P-channel MOS transistor has a thickness of 50 Å, for example. A $Si_3N_4$ layer is accumulated on the silicon oxide layer 9 by a CVD, for example, so as to form the silicon nitride layer 10 which has a thickness of 90 Å, for example.

Thereafter, as shown in FIG. 2E, P-type impurities such as As are implanted into the substrate 1 at only the N-channel MOS transistor region 4, so as to form the $n^-$-type diffusion layer 11. For example, an ion implantation using a resist mask is employed to implant the P-type impurities into the substrate 1.

Next, as shown in FIG. 2F, the silicon nitride layer 10 is selectively oxidized by a thermal oxidation, so as to form the silicon oxide layer 12 which is made of $SiO_2$ and has a thickness of 50 Å, for example. The silicon oxide layer 12 is formed by the oxidation of the surface portion of the silicon nitride layer 10. Hence, the second insulator layer 13 which is made up of the silicon oxide layer 9, the silicon nitride layer 10 and the silicon oxide layer 12 is formed to cover the P-channel MOS transistor region 3.

Then, as shown in FIG. 2G, a polysilicon is accumulated on the second insulator layer 13 by a CVD, for example, so as to form the second conductor layer 14. For example, the second conductor layer 14 has a thickness of 2500 Å.

Next, as shown in FIG. 2H, the second conductor layer 14 is selectively etched by a RIE, for example, so as to form the second gate electrode 15 in the P-channel MOS transistor region 3 and the sidewall layer 16 on the sidewall of the first gate electrode 8a. Thereafter, the second insulator layer which is made up of the silicon oxide layer 12, the silicon nitride layer 10 and the silicon oxide layer 9 is selectively etched by a RIE, for example, so as to form the second gate insulator layer 17 in the P-channel MOS transistor region 3. This second gate insulator layer 17 is made up of the silicon oxide layer 12, the silicon nitride layer 10 and the silicon oxide layer 9. In this state, the substrate 1 is exposed at the P-channel MOS transistor region 3 and the N-channel MOS transistor region 4.

Then, as shown in FIG. 2(I), the P+-type substrate diffusion layer 18 which becomes the source/drain is formed in the P-channel MOS transistor region 3, and the N+-type diffusion layer 19 is formed in the N-channel MOS transistor region 4 so as to form the substrate diffusion layer 20 which is made up of the diffusion layers 11 and 19 and becomes the source/drain.

The interlayer insulator layer 21 made up of SiO2 and PSG is formed thereafter, and the contact holes 22 are formed in the interlayer insulator layer 21 so that the substrate diffusion layers 18 and 20 and the first and second gate electrodes 8a and 15 are exposed. The interconnection layer 23 made of Al is formed so that contact is made to the substrate diffusion layers 18 and 20 and the first and second gate electrodes 8a and 15 via the contact holes 22. As a result, the semiconductor device shown in FIG. 2J is completed. Normally, the silicon nitride layer 10 extends to and is connected to a portion of another element which is formed on the substrate 1. That is, the silicon nitride layer 10 is made from the same layer which forms a portion of another element on the same substrate 1. In addition, the silicon nitride layer 10 of the N-channel MOS transistor may connect to the silicon nitride layer 10 (or 17) of the P-channel MOS transistor at a part of the semiconductor device.

Therefore, in this embodiment, the first gate insulator layer 7a of the N-channel MOS transistor is formed before the second gate insulator layer 17 of the P-channel MOS transistor is formed. In other words, the first gate insulator layer 7a of the N-channel MOS transistor and the second gate insulator layer 17 of the P-channel MOS transistor are formed by independent processes. For this reason, the first and second gate insulator layers 7a and 17 can respectively be formed to the desired values, and the threshold voltage $V_{th}$ and the like of the two transistors can be optimized.

In addition, because the silicon nitride layer 10 is formed on the sidewall of the first gate electrode 8a in the N-channel MOS transistor region 4 so as to act as an insulator layer, it is possible to improve the withstand voltage between the first gate electrode 8a and the interconnection layer 23. Furthermore, since the silicon oxide layer 9, the silicon nitride layer 10 and the silicon oxide layer 12 are formed on the sidewall of the first gate electrode 8a, it is possible to suppress deterioration caused by hot carriers and accordingly improve the reliability of the transistors and life time of the device.

In the described embodiment, the interlayer insulator layer 21 is formed so as to cover the sidewall layer 16 in a state where the sidewall layer 16 is left as shown in FIG. 2I. However, as a modification of the embodiment, the following modifications are possible.

Figure 3:
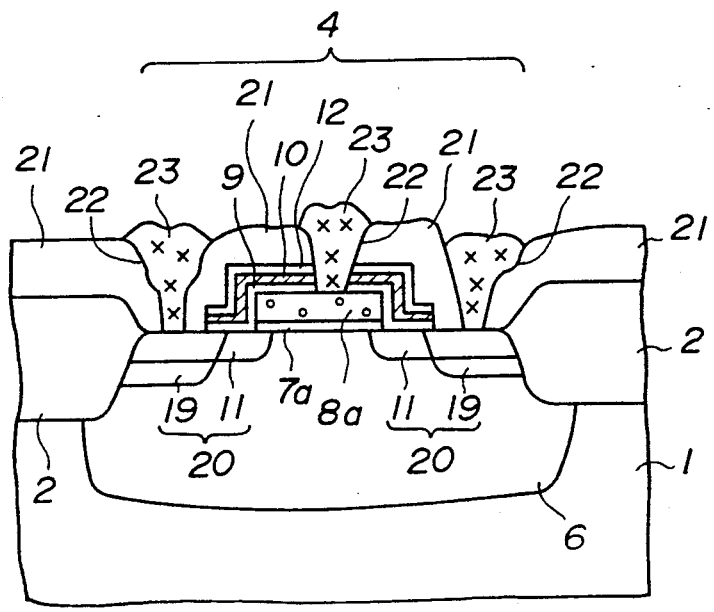
FIG. 3 is a cross sectional view showing a modification of the embodiment.

As a first modification of the embodiment, the sidewall layer 16 is removed in a step which is carried out between the processes described in conjunction with FIGS. 2I and 2J before the interlayer insulator layer 21 is formed. As a result, a semiconductor device shown in FIG. 3 is produced. In FIG. 3, only the N-channel MOS transistor part is shown for the sake of convenience. In this case, it is possible to reduce the stress on the substrate 1 and the like when compared to the case where the sidewall layer 16 is provided.

As a second modification of the embodiment, the sidewall layer 16 is oxidized to form the sidewall layer 16 into a silicon oxide sidewall layer before forming the interlayer insulator layer 21.

In a best mode of the present invention, the anisotropic etching in FIG. 2C and/or 2H is carried out using different etchant gasses for etching the polysilicon layer and the oxide layer. In other words, in FIG. 2C, for example, the polysilicon layer 8 is etched by an anisotropic etching using a first etchant gas to form the first gate electrode 8a and this etching is stopped at the first insulator layer 7. Then, an anisotropic etching using a second etchant gas which is different from the first etchant gas is carried out to etch the first insulator layer 7 to form the first gate insulator layer 7a. The anisotropic etching using different etchant gasses may be carried out similarly to form the second gate electrode 15 in FIG. 2H.

In the above embodiment, the N-channel MOS transistor is described as having the LDD structure. However, the present invention is not limited to such, and may similarly be applied to the P-channel MOS transistor and the normal source/drain diffusion layer structure. Furthermore, the first and second gate electrodes 8a and 15 may respectively be made of a material other than polysilicon, such as silicide and polycide.

The second insulator layer 13 may be made of a silicon nitride such as $Si_3N_4$ or a silicon nitride oxide such as SiON. Moreover, a multi-layer structure may be used as the second insulator layer 13, and the multi-layer structure may be $SiO_2/Si_3N_4/SiO_2$, $SiON/SiO_2$, $SiO_2$-$Si_3N_4$, $SiO_2/Si_3N_4$, $SiO_2/SiON$, $Si_3N_4/SiO_2$ or the like.

The structures of the semiconductor devices shown in FIGS. 2J and 3 bring out the following advantageous features. That is, because the silicon nitride layer 10 covers a top portion of the first gate electrode 8a, it is possible to prevent chemicals and the like from being absorbed by the first gate electrode 8a at a stage after the formation of the first gate electrode 8a, especially when the first gate electrode 8a is made of polysilicon. In addition, the provision of the silicon nitride layer 10 protects the top portion of the first gate electrode 8a from oxidation at a stage after the formation of the first gate electrode 8a. Therefore, the silicon nitride layer 11 acts as a protection layer for protecting the first gate electrode 8a, and it is possible to prevent the characteristics of the semiconductor device (MOS transistors) from becoming deteriorated.

Further, the present invention is not limited to these embodiments, but various variations and modifications may be made without departing from the scope of the present invention.

What is claimed is

1. A semiconductor device having a CMOS circuit which includes at least a P-channel MOS transistor and an N-channel MOS transistor, said semiconductor device comprising:
   a semiconductor substrate;
   an isolation region formed on said semiconductor substrate
   a P-channel MOS transistor region within said isolation region, including— an N-type well formed in the semiconductor substrate;

a first gate insulator layer formed on the semiconductor substrate;

P-type diffusion regions formed in the N-type well on both sides of the first gate insulator layer; and a first gate electrode formed on the first gate insulator layer, said first gate electrode and said P-type diffusion regions respectively forming gate, source and drain of the P-channel MOS transistor; and an N-channel MOS transistor region within said isolation region, including— a P-type well formed in the semiconductor substrate;

a second gate insulator layer formed on the semiconductor substrate;

N-type diffusion regions formed in the P-type well on both sides of the second gate insulator layer;

a second gate electrode formed on the second gate insulator layer, said second gate electrode having top and side surfaces, said second gate electrode and said N-type diffusion regions respectively forming gate, source and drain of the N-channel MOS transistor;

an insulating layer which covers a portion of the N-type diffusion regions, the side surfaces of the second gate electrode and at least a portion of the top surface of the second gate electrode, said insulating layer and said first gate insulator formed of identical material including nitrogen; and a sidewall layer formed on the insulating layer to provide a smooth coverage around the side of the second gate electrode and aligning with an edge of said insulating layer over the N-type diffusion regions, a thickness of said insulating layer under said sidewall layer substantially equal to a thickness of said first gate insulator layer.

2. The semiconductor device as claimed in claim 1, wherein the first and second gate electrodes are respectively made of a material selected from a group consisting of polysilicon, silicide and polycide.

3. The semiconductor device as claimed in claim 1, wherein the insulating layer is made of a material selected from a group consisting of $Si_3N_4$ and SiON.

4. The semiconductor device as claimed in claim 1, wherein the insulating layer has a multi-layer structure selected from a group consisting of $SiO_2/Si_3N_4/SiO_2$, $SiON/SiO_2$, $SiO_2Si_3N_4$, $SiO_2/Si_3N_4$, $SiO_2/SiON$ and $Si_3N_4/SiO_2$.

5. The semiconductor device as claimed in claim 1, which further comprises another element which is formed on the semiconductor substrate, and said insulating layer extends to connect to and form a portion of the element.

6. The semiconductor device as claimed in claim 1, wherein said insulating layer is connected to said first gate insulator at a part of the semiconductor device.

7. The semiconductor device as claimed in claim 1, wherein said sidewall layer is made of the same material as said first gate electrode.

8. The semiconductor device as claimed in claim 7, wherein said sidewall layer is made of polysilicon.

* * * * *

UNITED STATES PATENT AND TRADEMARK OFFICE
CERTIFICATE OF CORRECTION

PATENT NO. : 5,258,645
DATED : Nov. 2, 1993
INVENTOR(S) : SATO

It is certified that error appears in the above-indentified patent and that said Letters Patent is hereby corrected as shown below:

Col. 2, line 48, change "region 3" to --region 33--.

Col. 6, line 10, after "region" insert --3--.

Col. 8, line 41, change "layer 10" to --layer 11--;
line 47, change "layer 10" to --layer 11--.

Signed and Sealed this

Second Day of August, 1994

Attest:

BRUCE LEHMAN

Attesting Officer     Commissioner of Patents and Trademarks